(12) United States Patent
Debrosse et al.

(10) Patent No.: US 9,792,052 B2
(45) Date of Patent: *Oct. 17, 2017

(54) NONVOLATILE MEMORY INTERFACE FOR METADATA SHADOWING

(71) Applicant: INTERNATIONAL BUSINESS MACHINES CORPORATION, Armonk, NY (US)

(72) Inventors: John K. Debrosse, Colchester, VT (US); Blake G. Fitch, Croton-On-Hudson, NY (US); Michele M. Franceschini, White Plains, NY (US); Todd E. Takken, Brewster, NY (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/272,933

(22) Filed: Sep. 22, 2016

(65) Prior Publication Data

US 2017/0017396 A1 Jan. 19, 2017

Related U.S. Application Data

(63) Continuation of application No. 14/676,292, filed on Apr. 1, 2015, now Pat. No. 9,496,018.

(51) Int. Cl.
*G11C 11/16* (2006.01)
*G06F 3/06* (2006.01)
(Continued)

(52) U.S. Cl.
CPC ............ *G06F 3/0613* (2013.01); *G06F 3/061* (2013.01); *G06F 3/0602* (2013.01);
(Continued)

(58) Field of Classification Search
CPC .... G06F 3/061; G06F 13/1668; G06F 3/0688; G06F 3/0673; G06F 3/0602;
(Continued)

(56) References Cited

U.S. PATENT DOCUMENTS 5,570,381 A * 10/1996 Schofield ............... G11C 29/14
365/201
6,704,230 B1 3/2004 DeBrosse et al.
(Continued)

OTHER PUBLICATIONS

List of IBM Patents or Patent Applications Treated as Related dated Sep. 22, 2016, 2 pages.

*Primary Examiner* — Khamdan Alrobaie
(74) *Attorney, Agent, or Firm* — Tutunjian & Bitetto, P.C.; Jennifer R. Davis

(57) ABSTRACT

A memory includes multiple non-volatile memory devices, each having multiple nonvolatile memory cells. A write controller is configured to stream bits to the memory devices using a write data channel that optimizes a speed of writing to the memory devices to provide writes at a first speed. A read controller is configured to read bits from the memory devices, at a second speed slower than the first speed, using a read channel. A bi-directional bus that both the write controller and the self-referenced read controller share to access the plurality of non-volatile memory devices.

11 Claims, 8 Drawing Sheets

(51) Int. Cl.
*G11C 7/10* (2006.01)
*G11C 13/00* (2006.01)
*G06F 13/16* (2006.01)

(52) U.S. Cl.
CPC .......... *G06F 3/0656* (2013.01); *G06F 3/0659* (2013.01); *G06F 3/0673* (2013.01); *G06F 3/0679* (2013.01); *G06F 3/0688* (2013.01); *G06F 13/1668* (2013.01); *G11C 7/10* (2013.01); *G11C 7/1003* (2013.01); *G11C 7/1015* (2013.01); *G11C 11/1673* (2013.01); *G11C 11/1675* (2013.01); *G11C 11/1693* (2013.01); *G11C 13/004* (2013.01); *G11C 13/0004* (2013.01); *G11C 13/0061* (2013.01); *G11C 13/0069* (2013.01)

(58) Field of Classification Search
CPC ....... G06F 3/0659; G11C 7/10; G11C 7/1003; G11C 13/0004; G11C 13/004; G11C 11/1693; G11C 13/0069; G11C 7/1015; G11C 13/0061; G11C 11/1675; G11C 11/1673
See application file for complete search history.

(56) References Cited

U.S. PATENT DOCUMENTS

| | | | |
|---|---|---|---|
| 7,009,872 B2 | 3/2006 | Alva | |
| 7,463,510 B2 | 12/2008 | Hung et al. | |
| 7,646,628 B2 | 1/2010 | Sakimura et al. | |
| 7,974,124 B2 | 7/2011 | Chibvongodze et al. | |
| 8,767,463 B2 * | 7/2014 | Amidi | G11C 14/0009 365/185.08 |
| 9,496,018 B2 * | 11/2016 | Debrosse | G11C 11/1675 |
| 2002/0174291 A1 * | 11/2002 | Hsu | G06F 12/0893 711/105 |
| 2004/0120212 A1 | 6/2004 | Ooishi | |
| 2007/0283297 A1 * | 12/2007 | Hein | G11C 7/22 716/100 |
| 2009/0168525 A1 * | 7/2009 | Olbrich | G06F 13/1657 365/185.11 |
| 2012/0300563 A1 | 11/2012 | Chiu et al. | |

* cited by examiner

NONVOLATILE MEMORY INTERFACE FOR METADATA SHADOWING

BACKGROUND

Technical Field

The present invention relates to nonvolatile memory, including magnetoresistive random access memory. More particularly the present invention relates to a new type of interface for such nonvolatile memory.

Description of the Related Art

Most existing magnetoresistive random access memory (MRAM) offerings include very low-density chips with a static RAM (SRAM) interface. Present research for MRAM packaging is geared toward improving density with the aim of making MRAM a candidate for replacing dynamic RAM (DRAM). Phase Change Memory (PCM) is another type of nonvolatile memory. DRAM interfaces are appearing on both MRAM and PCM chips. However, there are potential applications for nonvolatile memory devices that are limited by the use of SRAM- or DRAM-type interfaces. Some MRAM interfaces are multibit, symmetric serial interfaces. To date, all of these SRAM-type, DRAM-type, and serial interfaces are symmetric interfaces, with equal or similar read and write bandwidths. Memory interfaces for symmetric operations are generally designed for generic applications, leading to a cost increase in low-margin, high volume applications such as hard drives and SSDs.

SUMMARY

A memory includes multiple non-volatile memory devices, each having multiple nonvolatile memory cells. A write controller is configured to stream bits to the memory devices using a write data channel that optimizes a speed of writing to the memory devices to provide writes at a first speed. A read controller is configured to read bits from the memory devices, at a second speed slower than the first speed, using a read channel. A bi-directional bus that both the write controller and the self-referenced read controller share to access the plurality of non-volatile memory devices.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
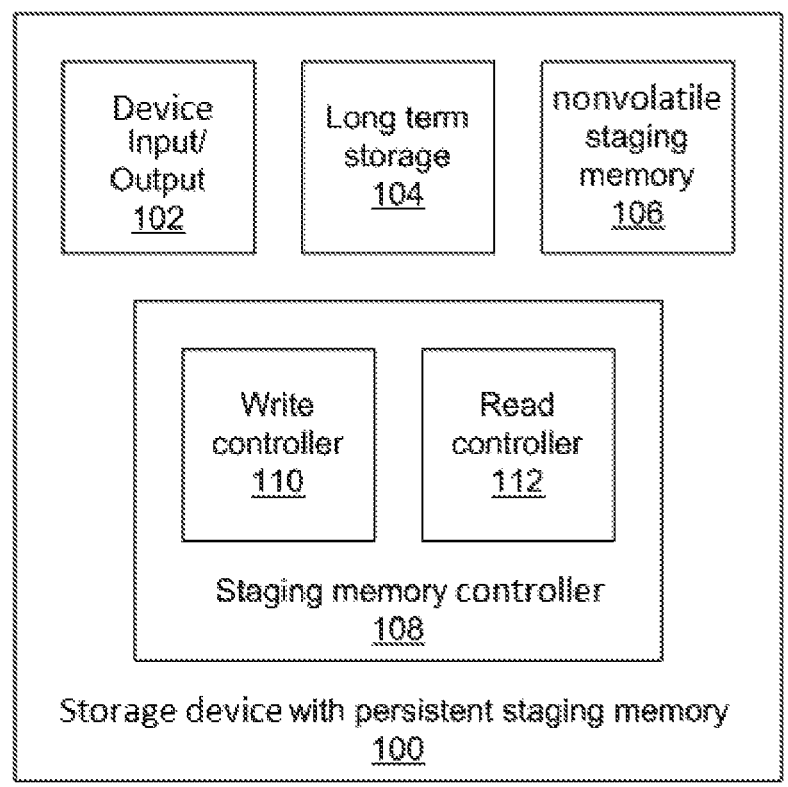
FIG. 1 is a diagram of a storage device with persistent staging memory, in accordance with the present principles.

Embodiments of the present principles provide an interface to nonvolatile memory, including magnetoresistive random access memory (MRAM), that is particularly well suited to use in a persistent staging buffer for metadata (and potentially also data) for storage devices, including hard disk drives (HDDs) and solid state drives (SSDs). The present embodiments thereby contribute to the construction of a fully persistent (or at least robustly consistent, in the case of metadata-only staging) storage device without the use of any backup power. By omitting batteries, capacitors, and the like, the size and cost of the devices may be reduced.

Metadata is used in storage to express the structure, both spatial and temporal, of the storage device and the stored data. Such data needs to be consistent, maintaining a valid and representative state of the memory at all times. Changes in the metadata track changes in the data and data structure, and a loss of metadata not only means a loss of data, but also a loss of the knowledge that data was lost. Persistent memory is a low-latency way to store a consistent metadata state, even through power loss or other disruption. The latency of such storage operations is the width of the time window in which metadata can be lost. Persistent memory allows for a decrease in this time window without relying on an external power source.

The present embodiments therefore provide metadata shadowing using MRAM or other nonvolatile memory. A "shadow" is a copy of a resource, in this case memory/storage, that allows certain relief from loss of that resource. A "shadow" may refer to the fact that there is a "fast" copy of the metadata in host memory, as well as in persistent memory. The copy in main memory is consulted for actual operations, while the copy in persistent memory is present only for reliability purposes. As a result, the shadow copy may be optimized for, e.g., reliability and cost instead of access speed, as it will not often be needed.

The interface of the present embodiments increases the bandwidth per chip, decreasing the cost and PCB area needed to produce a desired bandwidth. The interface furthermore increases the effective bandwidth per-pin for MRAM or other nonvolatile memory, which translates to a portion of the controller cost. Notably, the present embodiments do not make density a high priority, as the staging memory applications described herein do not need large amounts of storage capacity to be effective—only enough memory is needed to cover the latency period of the main memory, during which data could be lost. As such, it is contemplated that any suitable MRAM design may be employed as long as its density falls within reasonable design parameters.

Toward these ends, the present principles provide a "write mostly" interface that optimizes write performance. When using nonvolatile memory, such as MRAM, as persistent staging memory, the normal use case will be writing to such memory on a temporary basis. A read operation will only need to be performed if the main storage unit suffers a power failure, in which case the staging memory may be accessed to retrieve information that may not have been committed to long-term storage yet.

Referring now to the drawings in which like numerals represent the same or similar elements and initially to FIG. 1, a diagram of a storage unit 100 (referred to herein as a "disk" or "drive," though it is contemplated that any form of storage may be used) is shown. The drive 100 has an input/output (IO) unit 102 that provides access to the drive 100 for external devices. As disk input arrives at the IO unit 102, the information is slated for storage in long term storage 104. Long term storage may be any appropriate form of persistent memory, including magnetic platters or solid state memory. It is expected that committing such information will take time, characterized by the latency in encoding the incoming data on the physical storage device. During this time, a copy of the information is stored in nonvolatile staging memory 106 by way of staging memory interface 108. The interface 108 is optimized to make writing to the MRAM or other nonvolatile memory 106 as fast as possible, so as to keep up with the rate of incoming information. The staging memory interface 108 includes a write controller 110 to govern write operations to staging memory 106 and a read controller 112 to govern read operations from the staging memory 106.

Read operations at the staging memory interface 108 may take longer than write operations—read operations will only be performed in the case where some fault has occurred, preventing the information from being written to long-term storage 104 in a timely manner. It is anticipated that this fault may be a power outage, but it should be understood that the present principles will be applicable in any circumstance where writing to storage 104 is interrupted. When recovering from such a fault, staging memory interface 108 reads out the information stored in nonvolatile staging memory 106 and either applies such information directly to long-term storage 104 or provides it to an external recovery tool via disk IO 102.

The write controller 110 uses small granularity writes to the staging memory 106, while still maximizing write bandwidth. This moves the bandwidth from being interface-limited to being power-limited. For read operations, the read controller 112 may use a self-referenced read that may be daisy-chained. As a result, the staging memory interface 108 has asymmetric read/write speeds. The read controller 112 may include a interface that makes a number of compromises to read bandwidth, in order to reduce cost, as long as write bandwidth is not sacrificed.

Figure 2:
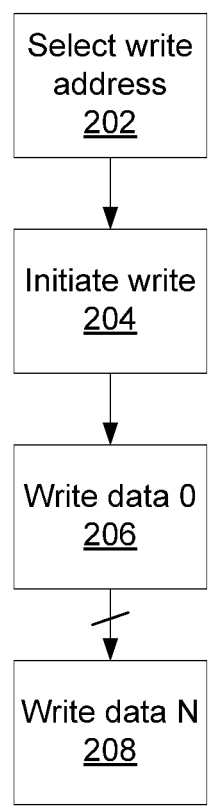
FIG. 2 is a block/flow diagram showing a method for writing to a nonvolatile random access staging memory in accordance with the present principles.

Referring now to FIG. 2, a method for writing information to the nonvolatile staging memory 106 is shown. In this embodiment, an address for writing is provided at block 202. Block 204 issues the write command to the nonvolatile staging memory 106, after which write data may be streamed (e.g., writing sequential bytes in blocks 206 through 208). It is assumed that subsequent data bytes are in contiguous memory addresses. In one exemplary embodiment, data may be written in groups of 32 bits to allow for higher write bandwidths while maintaining close-to-byte addressability. Notably, this method is streamlined for writing data, with a minimum of control information or processing.

Although it is specifically contemplated that 32-bit groups may be used, other group sizes may be used instead in accordance with the present principles. However, 32-bit groups are large enough that full practical bandwidth inside the chip will be achieved by writing all 32 bits in parallel into different memory cells. At the same time, this size still offers small granularity, such that if there is a small metadata update only 32 bits need be written to nonvolatile staging memory 106.

To accomplish a high rate bit streaming, data is buffered at the nonvolatile staging memory 106. Each chip in the nonvolatile staging memory 106 gathers enough data to optimize the write bandwidth into a local internal buffer. Then it performs the write of all the buffered bits in parallel. So data can be streamed at high speed serially in the interface and, only when the write granularity (e.g., 32 bits) is accumulated, then the nonvolatile staring memory 106 performs the write.

In one embodiment, a shared data/command/address bus may be used. Part of the cost of a hardware system can be attributed to connections on the printed circuit board. The main cost factor of these connections is that there has to be at least one component pin at each end of the connection. When an integrated circuit, such as a controller, needs to communicate with a large number of chips, such as a large pool of flash memory chips, the number of connections needed between controller and memory chips is proportional to the number of memory chips. The larger the number of connections, the more expensive the circuit board becomes and therefore the cost of the memory controller also rises. The actual number of connections strongly depends on the structure of the bus. If, on a bus, the same pins are used alternatively to transmit addresses, instructions (commands) and data, there will be a pin count saving with respect to having a different set of pins for addresses, commands and data. For further savings, the write-enable pin can be used to input new data. In this case the write-enable pin acts as a clock for the new data to the chip. In a synchronous implementation, a clock pin would serve this purpose.

If a synchronous interface is used, a clock pin is used as an input to the chip and all signals are synchronized to that clock. As an alternative to a synchronous interface, other signals may act as a cue that the input pins to the memory chip have changed and should be interpreted.

Figure 3:
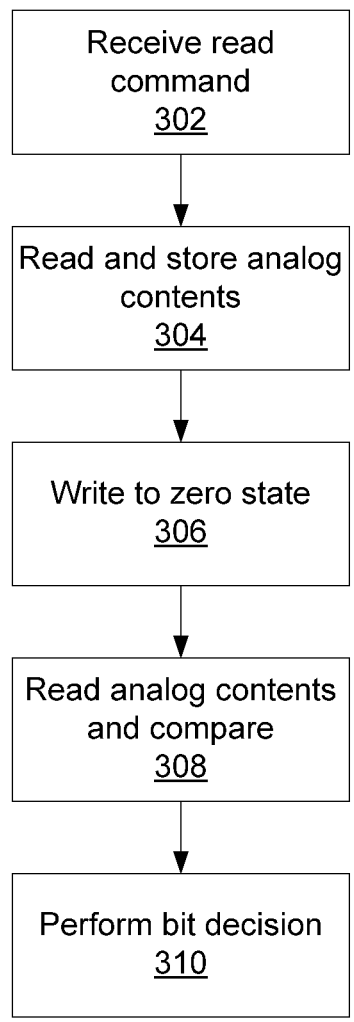
FIG. 3 is a block/flow diagram showing a method for a self-referenced read from a staging memory in accordance with the present principles.

Referring now to FIG. 3, a self-referenced read method is shown. Block 302 receives a read command, for example after a power loss when data needs to be recovered. Upon receiving the command, the memory interface 108 decodes the row and column from the read command, such that a sense amplifier is electrically connected to a selected memory cell in the nonvolatile staging memory 106. If the nonvolatile staging memory is MRAM, then the memory cell would be a magnetic tunnel junction. The memory cell is read in block 304. In the present embodiments this is accomplished by forcing a small voltage, e.g., less than 100 mV onto the selected bitline and sensing the resulting current. A value corresponding to the data state current is stored, for example as a voltage on a capacitor or as a digital value in a register.

The memory cell is then written into a known reference state in block 306, for example a logical zero, and the read operation is repeated in block 308 to produce a reference state current. The reference state current is then compared to the stored current. Based on the comparison, block 310 makes a determination as to the bit value that was stored. If the currents are approximately equal to one another, that represents a first logical state, and if they are different from one another, that represents a second logical state. The original data state may then be restored, or a new value may be written if desired.

While the self-referenced memory reads described above have a power and performance cost due to having multiple steps, they are largely insensitive to bit-to-bit variations in memory cell impedance, since the same exact cell is sensed for the data and reference phases. As an alternative to the above, a self-referencing scheme could force current and sense voltage to determine the memory cell impedance in a read step. Using a self-referenced read controller gains bit-to-bit insensitivity to variations in memory cell impedance. While this reduces read bandwidth and increases read latency, neither of these is important for write-mostly applications.

Figure 4:
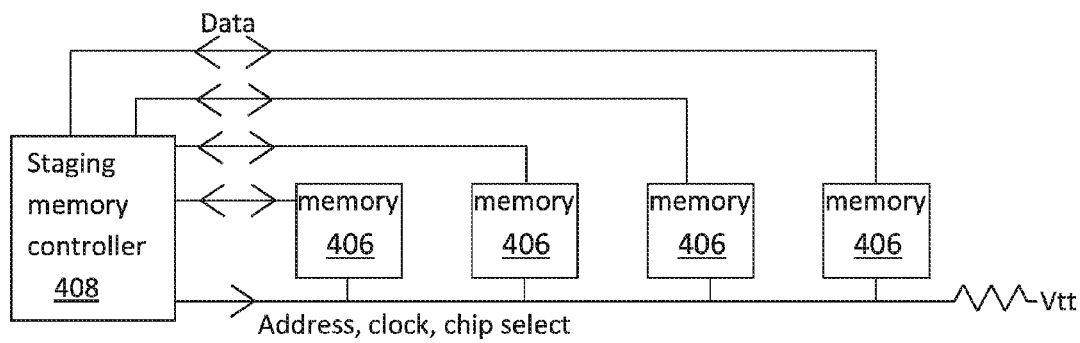
FIG. 4 is a diagram showing a parallel, SRAM- or DRAM-style interface, where the data write speeds per data channel have been increased in accordance with the present principles.
Figure 5:
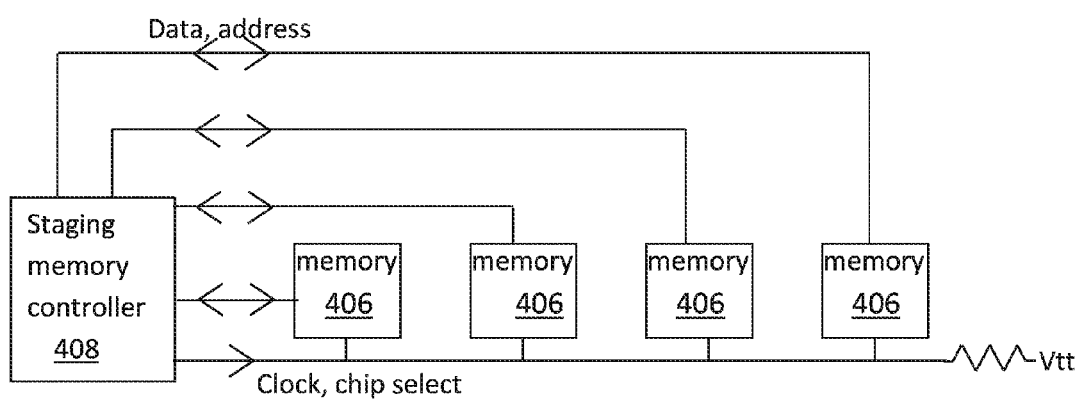
FIG. 5 is a diagram showing a partially serialized interface, where pin count has been reduced in accordance with the present principles.
Figure 6:
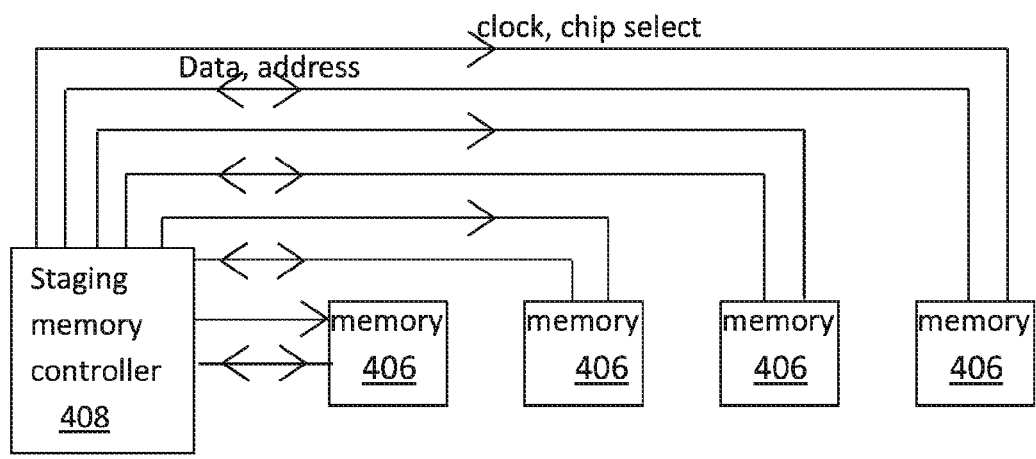
FIG. 6 is a diagram showing a serial interface, where clock is transmitted on separate pins from data and address, in accordance with the present principles.
Figure 8:
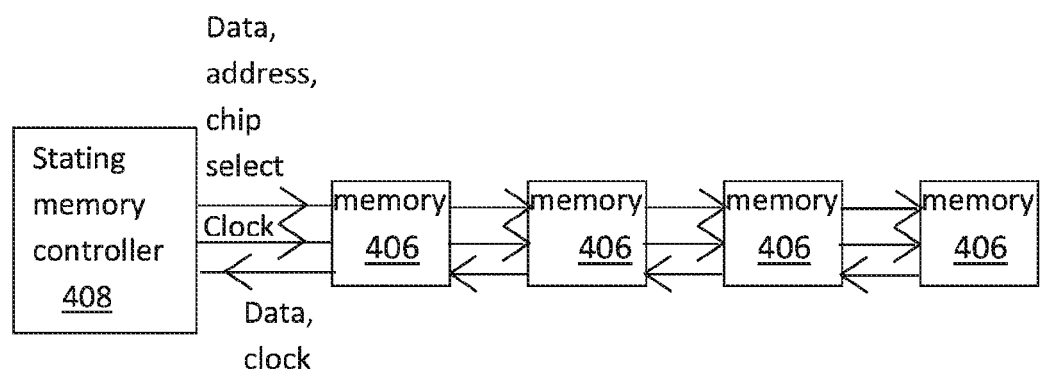
FIG. 8 is a diagram of a serial interface where controller pin count has been reduced by daisy-chaining the connections in series between memory devices in accordance with the present principles.
Figure 9:
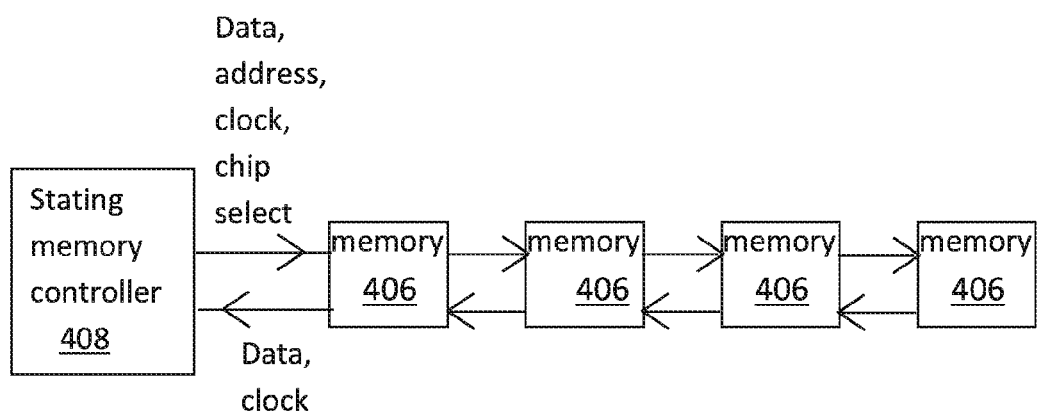
FIG. 9 is a diagram of a serial interface where pin count has been reduced by transmitting write clock information on the same pins as write data and address in accordance with the present principles.

Referring now to FIG. 4, a parallel-bus read architecture is shown. A staging memory 408 communicates with individual memory cells 406 directly. The signaling and bus interface between the staging memory interface 408 and the nonvolatile staging memory 406 can be optimized to take advantage of the fact that memory reads from the staging memory 406 can have slow bandwidth and high latency. Whether the bus from the staging memory interface 408 is a parallel bus as in FIG. 4, a separate serial bus to each nonvolatile memory device as in FIGS. 5 and 6, or a daisy-chained serial bus as in FIG. 8, the fact that the read interface can operate slowly means that the read driver can be an uncalibrated, minimum-strength, pulldown-only field effect transistor. This means that, even if the read bus shares a pin or pins with the write bus, the write bus will see little reduction of signaling rate due to the read driver's low capacitance. Write speeds can therefore be increased, using fewer write bus pins and providing a lower cost per unit of write bandwidth.

Figure 11:
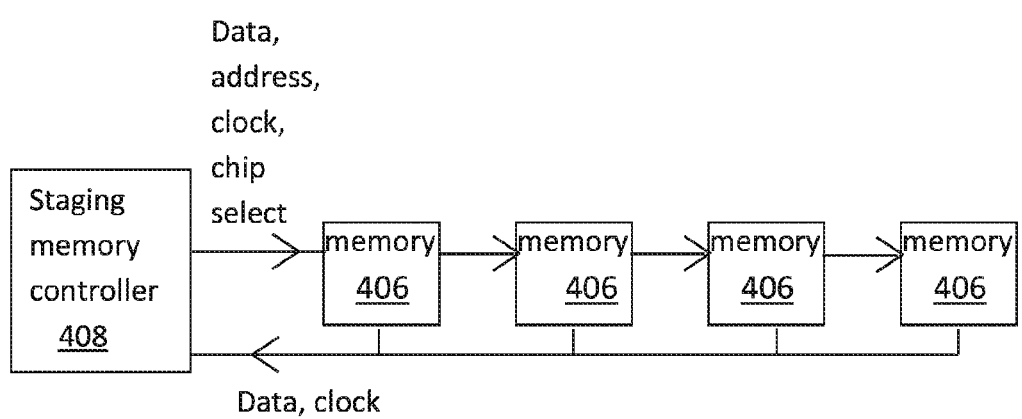
FIG. 11 is a diagram of a serial interface where the read channel has been broken out onto separate pins in accordance with the present principles.

The fact that the read interface can operate slowly also allows the read bus to be a single ganged bus touching all nonvolatile memory devices. If the bit time on the read bus is much longer than the propagation time of signals along the length of the bus, then bus topology and wave reflections become unimportant and the pin count on the staging memory interface can be reduced by connecting all nonvolatile memory devices to the same bus, as show in FIGS. 11 and 12.

The fact that high read bus latency is acceptable means that read bus command, address, and data information may be combined, thereby reducing read bus pin count. The read bus can be reduced to a single net with a single pin per device. This one-wire protocol is usable because the latency required to decode the serial protocol is not significant.

The fact that reads are rarely performed permits combining read and write serial buses. There is significant latency and protocol overhead to change a bidirectional bus between read and write operation when this bus is a serial bus, with command and address information transmitted over the same nets as data. Because the direction of data transmission is rarely changed between the staging memory interface and the nonvolatile staging memory devices, serializing the address and control information into the same nets as data incurs less of a performance penalty and is therefore more desirable. This can be used to reduce signaling interface pin counts and therefore lower interface costs.

Figure 7:
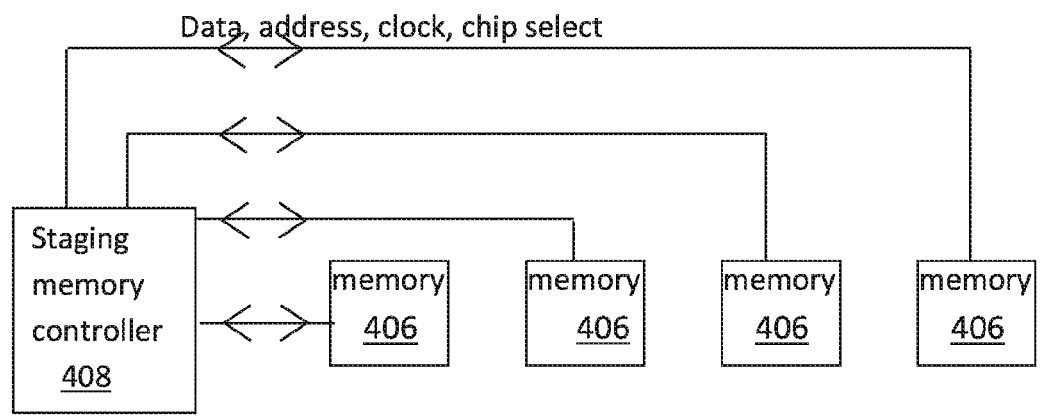
FIG. 7 is a diagram showing a serial interface where pin count has been reduced by transmitting clock information on the same physical channels as data and address in accordance with the present principles.
Figure 10:
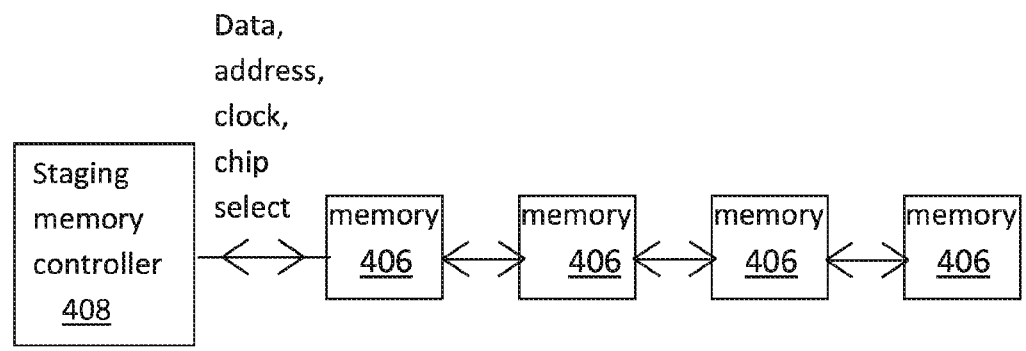
FIG. 10 is a diagram of a serial interface where pin count has been reduced by combining the read channel onto the same pins as the write channel in accordance with the present principles.

The fact that reads are rarely performed also facilitates eliminating a separate clock pin in a bidirectional serial bus. Clock-data-recovery is commonly used on unidirectional, high-speed serial buses. The separate clock signal is eliminated by performing a training sequence, whereby the receiver varies the time at which it samples data, until the optimal data eye is detected. Such clock-data-recovery uses significant training time each time the link is started. For this reason this technique is typically used only on unidirectional buses. However, since in this invention the bus direction is rarely turned around, this training latency is not important. Therefore, clock-data-recovery can be used on a high speed data write channel, even when the same serial bus is capable of being occasionally turned around and used for reads Eliminating separate clock pins on bidirectional serial buses as in FIGS. 7 and 10 saves interface pins and reduces cost.

Figure 12:
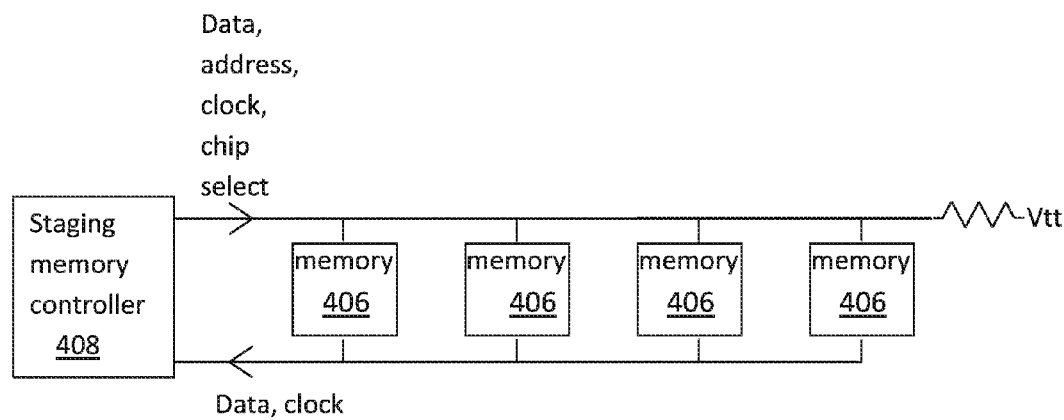
FIG. 12 is a diagram of a serial interface with separate read and write channels, where both read and write pin memory device counts have been reduced and write latency has been reduced, by eliminating daisy chains and making both read- and write-bus topologies use a ganged bus in accordance with the present principles.
Figure 13:
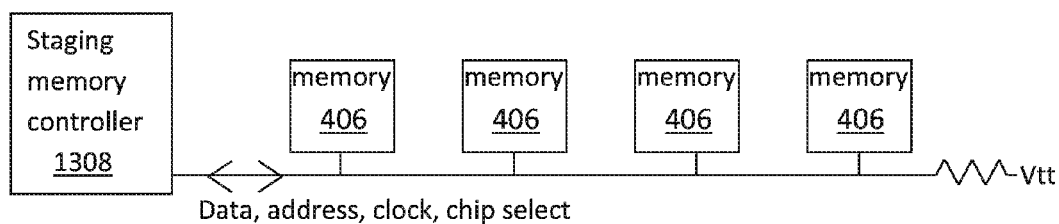
FIG. 13 is a diagram of a serial interface using a single, ganged bus in accordance with the present principles.

The asymmetric read and write speeds between the staging memory interface and the nonvolatile staging memory devices permits combining read and write nets on a ganged bus. High speed ganged buses can only be driven unidirectionally from a single driver past multiple receivers located along a trunk line to a matched-impedance termination resistor at the far end of the line from the driver. This is how the address and control nets on a DRAM parallel interface are commonly routed. Such net topologies cannot be made bidirectional when read and write speeds are similar. High speed memory reads would not be possible, since the memory devices are distributed along the length of the trunk line and wave reflections would be a problem. FIG. 12 shows a high speed ganged write bus separate from a low speed ganged read bus. However, the fact that the read bus memory drivers have low parasitic capacitance, plus the fact that distributed read drivers are implemented at low read bus speeds means that ganged trunk-line write and read buses may be used in the present embodiments. As shown in FIG. 13, a single bidirectional bus can carry high speed write information from the staging memory interface 1308 to the nonvolatile staging memory devices and can occasionally be turned to carry low speed read information from the memory devices back to the staging memory interface controller.

The present embodiments combine high speed serial writes, clock-data-recovery, and a trunk-line ganged bus topology, all while preserving the ability to have occasional slow reads on the same pins. This means that the staging memory bus can be reduced to a single wire with a single pin per device. As shown in FIG. 13, this bus interface would preserve streaming write performance and retain the ability to have occasional, slow reads, and would do so in a low pin count, low cost configuration.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B)

only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of an MRAM interface for metadata shadowing (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A memory, comprising:
   a plurality of non-volatile memory devices, each comprising a plurality of nonvolatile memory cells;
   a write controller configured to stream bits to the memory devices using a write data channel that optimizes a speed of writing to the memory devices to provide writes at a first speed;
   a read controller configured to read bits from the memory devices, at a second speed slower than the first speed, using a read channel; and
   a bi-directional bus that both the write controller and the read controller share to access the plurality of non-volatile memory devices.

2. The memory of claim 1, wherein the read controller is configured to read bits from the memory devices, such that the read controller has a single read pin to control a read operation for all of the memory devices.

3. The memory of claim 1, wherein the memory devices are connected in a daisy-chained fashion, wherein each device communicates via a first bus to a previous device in the chain and wherein each device communicates via a second bus to a subsequent device in the chain.

4. The memory of claim 1, wherein the read controller is configured to read a stored state of the memory cells in the memory devices, to write a reference state to the memory cells, to read the reference state of the memory cells, and for each memory cell to compare the stored state to the reference state to determine a stored bit.

5. The memory of claim 1, wherein the read controller is configured to perform a read only after a fault has occurred.

6. The memory of claim 1, wherein the plurality of non-volatile memory devices are a staging buffer for metadata.

7. The memory of claim 1, wherein the non-volatile memory devices are magnetoresistive random access memory devices.

8. The memory of claim 1, wherein the non-volatile memory devices are phase change memory devices.

9. The memory of claim 1, wherein each memory device comprises an uncalibrated, minimum-strength, pulldown-only field effect transistor as a read driver.

10. The memory of claim 1, wherein the bi-directional bus is a ganged bus with a single trunk line and with impedance-matched termination on the far end of the trunk line from the write driver.

11. A non-transitory computer readable storage medium comprising a computer readable program for memory management, wherein the computer readable program when executed on a computer causes the computer to perform the steps of:
   streaming bits to a memory buffer on a memory device using a write data channel that optimizes a speed of writing to the memory devices;
   writing the bits to consecutive non-volatile memory cells in the memory device at a first speed, using a bi-directional bus;
   reading bits from the memory devices using a read data channel to provide reads at a second speed that is slower than the first speed, using the bi-directional bus.

* * * * *